(12) United States Patent
Jang et al.

(10) Patent No.: US 7,511,297 B2
(45) Date of Patent: Mar. 31, 2009

(54) PHASE CHANGE MEMORY DEVICE AND METHOD OF FABRICATING THE SAME

(75) Inventors: Jae-Hoon Jang, Gyeonggi-do (KR); Ki-Nam Kim, Seoul (KR); Soon-Moon Jung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/855,952

(22) Filed: Sep. 14, 2007

(65) Prior Publication Data
US 2008/0111121 A1 May 15, 2008

(30) Foreign Application Priority Data
Sep. 14, 2006 (KR) .................. 10-2006-0089318

(51) Int. Cl.
*H01L 29/08* (2006.01)
*H01L 21/00* (2006.01)

(52) U.S. Cl. ............... 257/42; 257/68; 257/44; 257/109; 257/910; 257/E31.008; 257/E31.029; 257/E29.087; 257/E29.327; 257/E21.053; 257/E21.456; 438/84; 438/95; 438/102; 438/255

(58) Field of Classification Search .......... 257/42, 257/44, 68, 109, 910, E21.053, E21.456, 257/E29.087, E29.327, E31.008, E31.029; 438/84, 95, 102, 255
See application file for complete search history.

(56) References Cited

U.S. PATENT DOCUMENTS

2003/0132501 A1* 7/2003 Gill et al. ................ 257/505
2003/0185034 A1* 10/2003 Fricke et al. ................ 365/63
2005/0018526 A1 1/2005 Lee
2005/0194620 A1* 9/2005 Dennison et al. ............ 257/246
2006/0138467 A1* 6/2006 Lung ........................ 257/209
2006/0157683 A1* 7/2006 Scheuerlein ................ 257/4

FOREIGN PATENT DOCUMENTS

| JP | 2005-536052 | 11/2005 |
| KR | 2004/017437 | 2/2004 |
| KR | 10-2004-0038421 | 5/2004 |
| KR | 10-2004-0047272 | 6/2004 |

(Continued)

OTHER PUBLICATIONS

English language abstract of Korean Publication No. 10-2005-0011059.
English language abstract of Korean Publication No. 10-2005-0053617 in the form of the abstract of International Publication No. WO 2004/017437.

(Continued)

*Primary Examiner*—Thanh V Pham
(74) *Attorney, Agent, or Firm*—Marger Johnson & McCollom, P.C.

(57) ABSTRACT

A phase change memory device and a method of fabricating the same are disclosed. The phase change memory device includes a first conductor pattern having a first conductivity type and a sidewall. A second conductor pattern is connected to the sidewall of the first conductor pattern to form a diode. A phase change layer is electrically connected to the second conductor pattern and a top electrode is connected to the phase change layer.

26 Claims, 10 Drawing Sheets

FOREIGN PATENT DOCUMENTS

| | | |
|---|---|---|
| KR | 10-2005-0011059 | 1/2005 |
| KR | 10-2005-0053617 | 6/2005 |
| KR | 10-2005-0099589 | 10/2005 |
| KR | 10-2006-0001056 | 1/2006 |
| KR | 10-2006-0001084 | 1/2006 |
| KR | 10-2006-0002133 | 1/2006 |
| KR | 10-2006-0007224 | 1/2006 |

OTHER PUBLICATIONS

English language abstract of Japanese Publication No. 2005-536052 in the form of the abstract of International Publication No. WO 2004/017437.

English language abstract of Korean Publication No. 10-2006-0001084.

* cited by examiner

PHASE CHANGE MEMORY DEVICE AND METHOD OF FABRICATING THE SAME

CROSS-REFERENCE TO RELATED APPLICATIONS

This patent application claims the benefit of foreign priority under 35 U.S.C. § 119 to Korean Patent Application No. 10-2006-89318, filed on Sep. 14, 2006, the entire contents of which are hereby incorporated by reference.

BACKGROUND

1. Field of Invention

Embodiments exemplarily disclosed herein generally relate to semiconductor devices and methods of fabricating the same, and more particularly, to a phase change memory device and a method of fabricating the same.

2. Discussion of the Related Art

A phase change memory device stores data by using a stable state of a phase change material. The phase change material can stably exhibit one of two states depending upon a temperature applied thereto. After heating the phase change material at a temperature higher than a melting temperature of the phase change material and then cooling it down, the phase change material layer exhibits a substantially amorphous state. After heating the phase change material at a temperature higher than a crystallization temperature and lower than the melting temperature and then cooling it down, the phase change material layer exhibits a substantially crystalline state.

The electrical resistivity of the phase change material layer exhibiting a substantially amorphous state is higher than the electrical resistivity of the phase change material layer exhibiting a substantially crystalline state. Accordingly, the logic state of a memory cell formed of phase change material can be differentiated as either logic 1 or logic 0 by detecting a current that flows through the phase change material layer during a read mode.

A cell of a typical phase change memory device includes one access transistor and one phase change element. FIG. 1 is an equivalent circuit of a cell array in a conventional access transistor-type phase change memory device.

Referring to FIG. 1, an access transistor Tx and a phase change device R are connected between word lines WL and bit lines BL. A gate of the access transistor Tx is connected to the word line WL, its drain is connected to the bit line BL, and its source is connected to the phase change device R.

In the device shown in FIG. 1, a unit cell has a structure similar to that of DRAM. In a case of a NOR cell array structure, the size of a cell may have an $8F^2$ structure, which is 8 times of a minimum feature size F. However, when using the minimum size access transistor, a sufficient current may not be supplied for phase change. Therefore, a big size transistor of 15 through $20F^2$ structure is required.

Recently, diode-type access phase change memory devices have been proposed. FIG. 2 is an equivalent circuit of a cell array in a conventional access diode-type phase change memory device.

Referring to FIG. 2, the cell array includes a structure where an access diode Dx and a phase change device R are connected in series between word lines WL and bit lines BL. In this structure, the access diode Dx and the phase change device R are connected in series between the word lines WL and bit lines BL such that the size of a memory cell can be reduced as compared to the size of the memory cell shown in FIG. 1.

FIG. 3A is a plan view of a conventional phase change memory device. FIG. 3B is a sectional view of the conventional phase change memory device, taken along line I-I' of FIG. 3A.

Referring to FIGS. 3A and 3B, a word line 10 extends toward one direction and is disposed on a semiconductor substrate. A first conductor pattern 12 and a second conductor pattern 14 are sequentially stacked on the word line 10. The word line 10 is typically formed as an impurity diffusion layer having a first conductivity type, and the first conductor pattern 12 and the second conductor pattern 14 are formed as an impurity diffusion layer having a second conductivity type. For example, the word line 10 is formed of an n-type impurity diffusion layer, and the first and second conductor patterns 12 and 14 are formed of a p-type impurity diffusion layer. The word line 10 and the first conductor pattern 12 constitute PN-junction to form a diode.

A bottom electrode 16 is formed on the second conductor pattern 12 and a heater 18 is formed on the bottom electrode 16. A phase change layer 20 and a bit line 22 are formed on the heater 18. The bit line 22 corresponds to the top electrode and extends along a direction perpendicular to the word line 10.

When forming the word line 10 and the bit line 22 having a minimum line width, the area occupied by a unit cell may be two times the minimum line width. Accordingly, this improves the degree of integration as compared to traditional transistors. However, when the area occupied by the PN junction of the word line 10 and the first conductor pattern 12 is $F^2$. As a result, a sufficient current to induce phase change within the phase change layer 20 cannot be applied. Therefore, the degree of integration of the phase change memory device is reduced as the size of cell increases.

SUMMARY

Embodiments exemplarily described herein provide a highly integrated semiconductor device such as a phase change memory device capable of increasing a current of a diode, and a method of fabricating the same.

Embodiments exemplarily described herein also provide a semiconductor device such as a phase change memory device capable of reducing an amount of current required to induce phase change within a phase change layer, and a method of fabricating the same.

One embodiment exemplarily described herein can be characterized as a semiconductor device that includes a diode formed on a semiconductor substrate. The diode may include a first conductor pattern of a first conductivity type and having a sidewall defining a structure and a second conductor pattern connected to the sidewall of the first conductor pattern. A phase change layer may be electrically connected to the second conductor pattern and a top electrode may be connected to the phase change layer.

Another embodiment exemplarily described herein can be characterized as a semiconductor device that includes an insulating layer having a hole on a semiconductor substrate. A first conductor pattern of a first conductivity type is formed in a lower region of the hole such that the first conductor pattern is a substantially cylindrical structure having a sidewall and a bottom. An insulator pattern is formed in an upper region of the hole and on the first conductor pattern such that the insulator pattern is a substantially cylindrical structure having a sidewall. A second conductor pattern fills an area surrounded by the first conductor pattern such that the first conductor pattern and the second conductor pattern form a diode. A bottom electrode is formed on the second conductor pattern in an area surrounded by the insulator pattern. A phase change layer and a top electrode are sequentially stacked on the bottom electrode.

Yet another embodiment exemplarily described herein can be characterized as a method for forming a semiconductor device that includes forming a first conductor pattern of a first conductivity type on a semiconductor substrate such that the first conductor pattern has a sidewall defining a structure, forming a second conductor pattern connected to the sidewall of the first conductor pattern to form a diode, forming a phase change layer electrically connected to the second conductor pattern and forming a top electrode connected to the phase change layer.

BRIEF DESCRIPTION OF THE FIGURES

The accompanying figures are included to provide a further understanding of the embodiments exemplarily described herein, and are incorporated in and constitute a part of this specification. In the figures.

DETAILED DESCRIPTION

Figure 1:
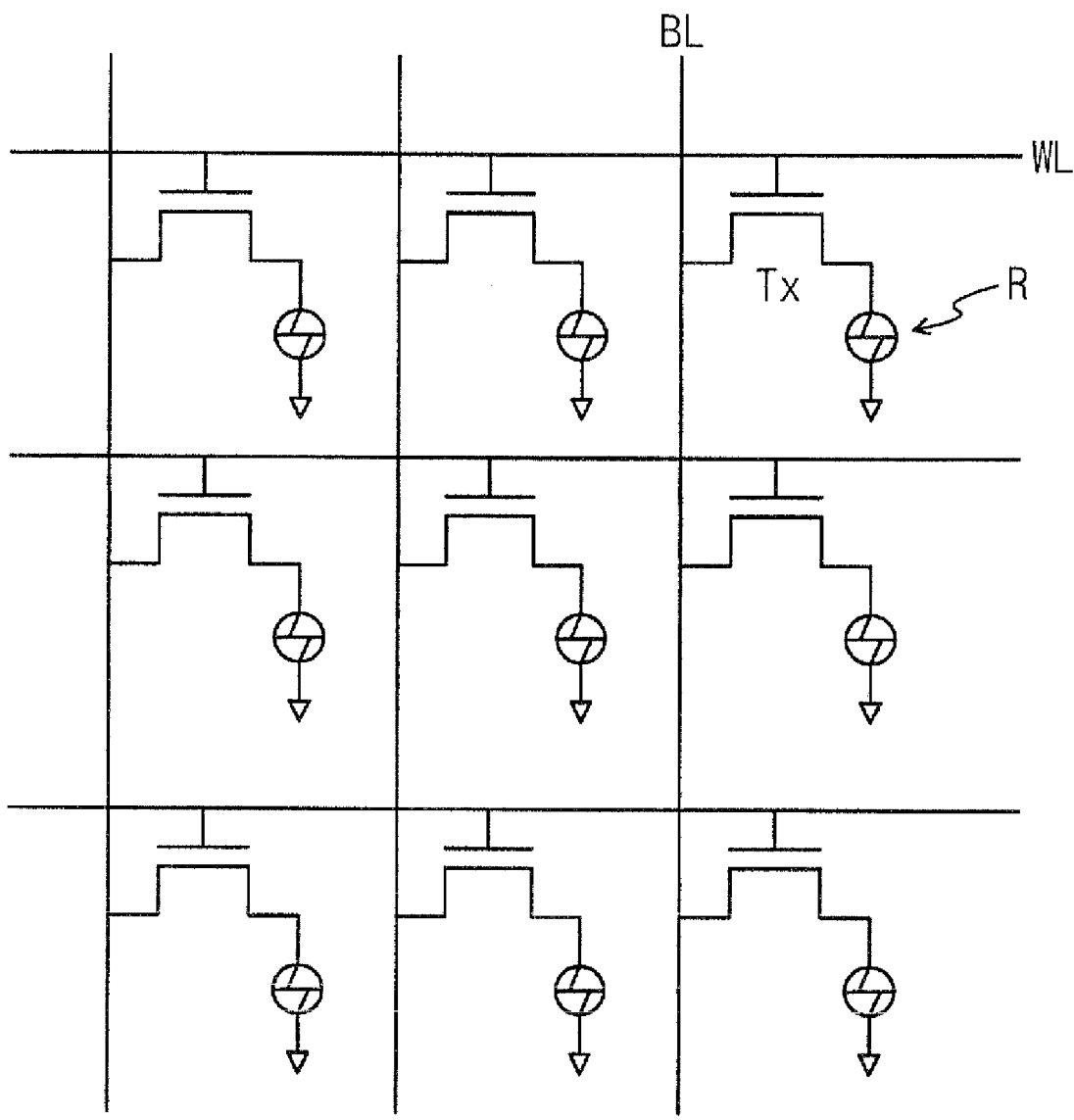
FIG. 1 is an equivalent circuit of a cell array in a conventional access transistor-type phase change memory device.
Figure 2:
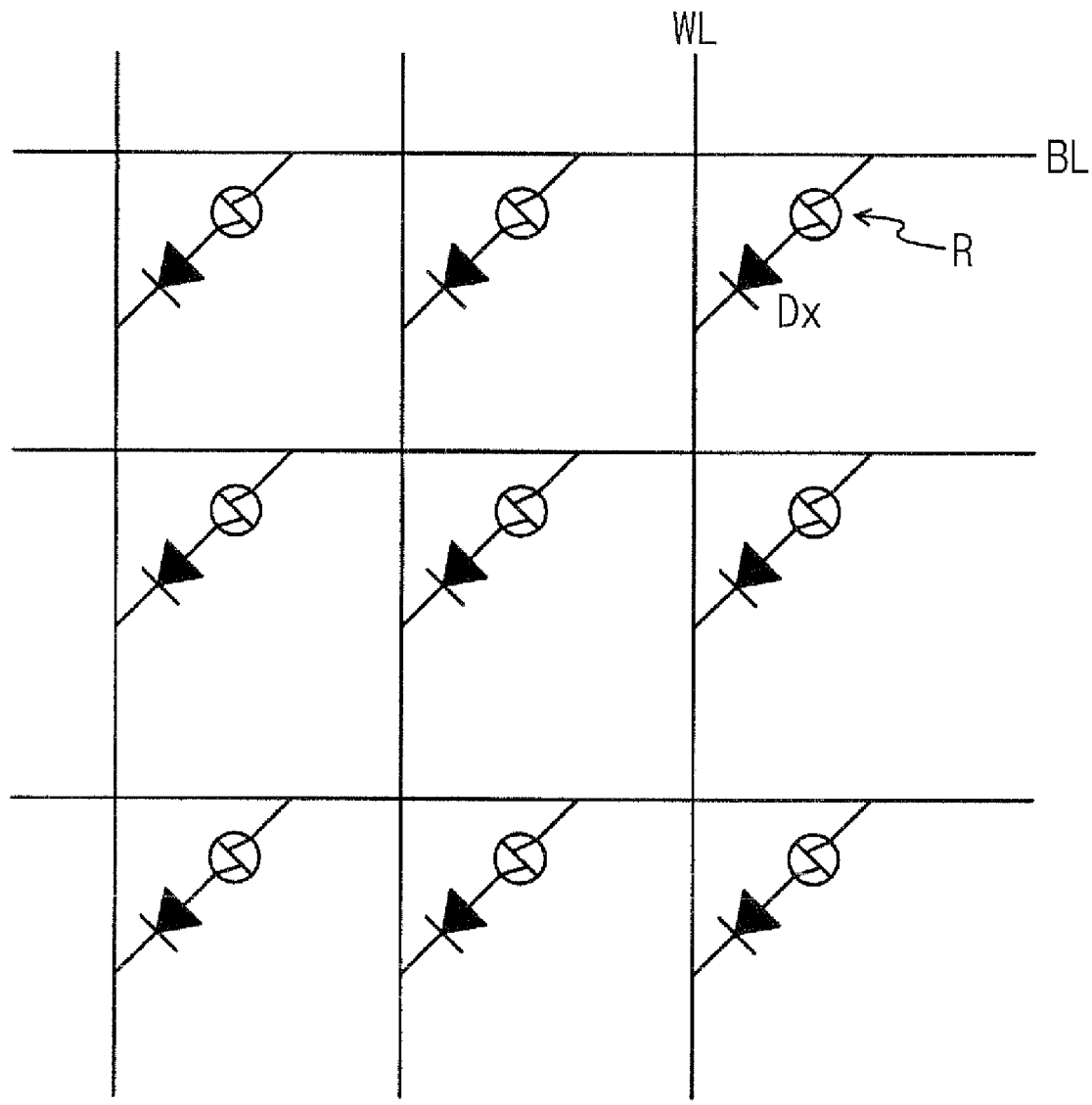
FIG. 2 is an equivalent circuit of a cell array in a conventional access diode-type phase change memory device.
Figure 3A:
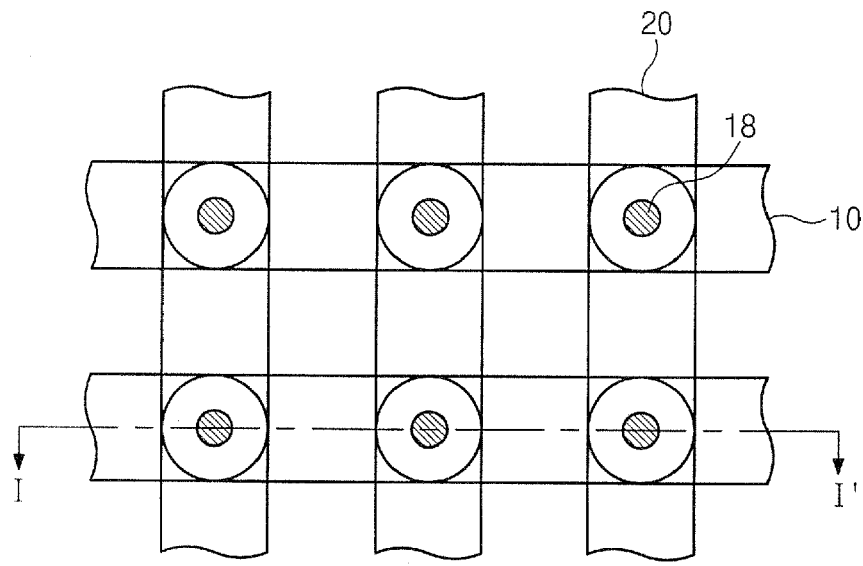
FIGS. 3A and 3B are plan and sectional views, respectively, of a conventional access diode-type phase change memory device.
Figure 3B:
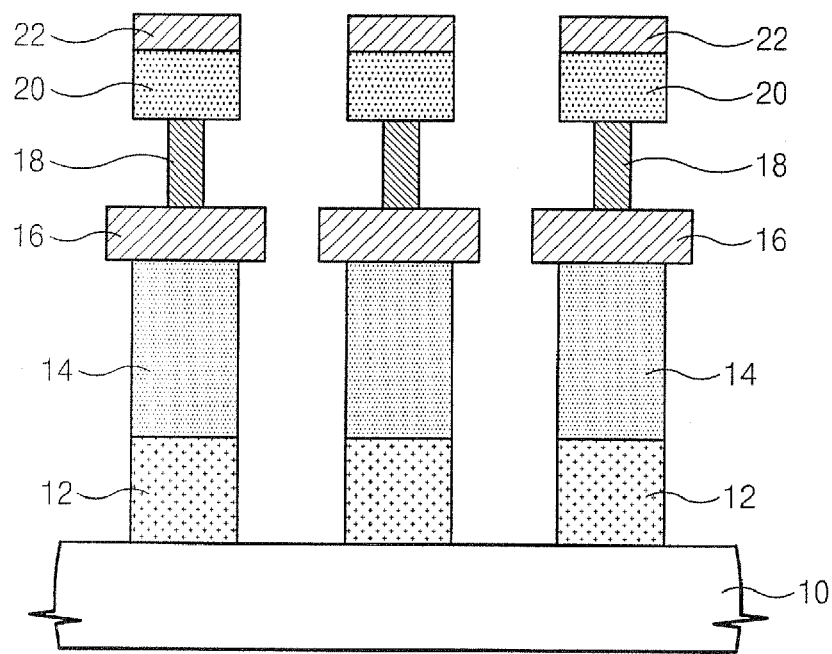

Exemplary embodiments will now be described below in more detail with reference to the accompanying drawings. These embodiments may, however, be realized in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 4A:
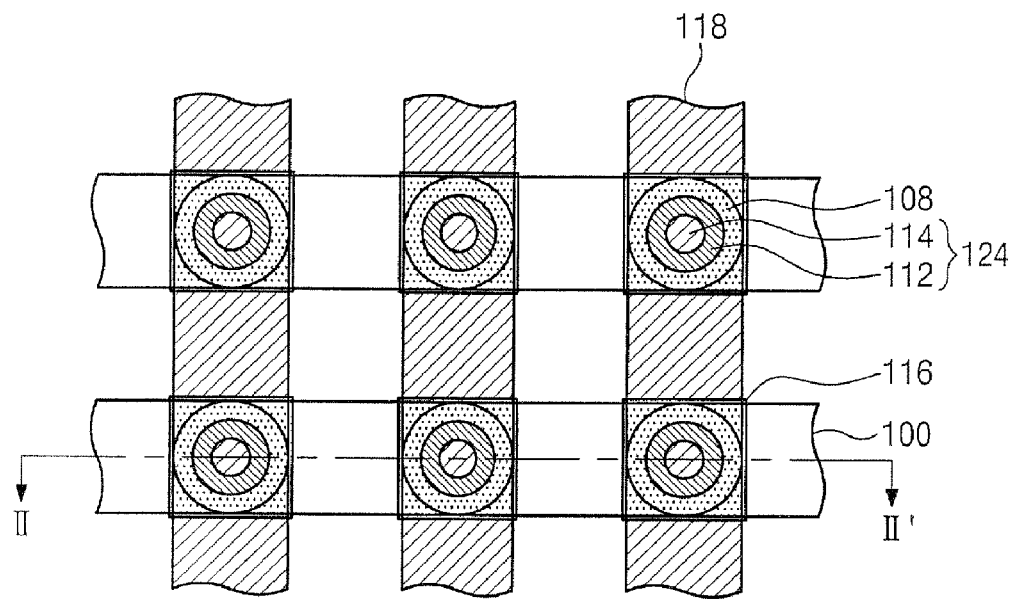
FIGS. 4A and 4B are plan and sectional views, respectively, of a phase change memory device according to a first embodiment.
Figure 4B:
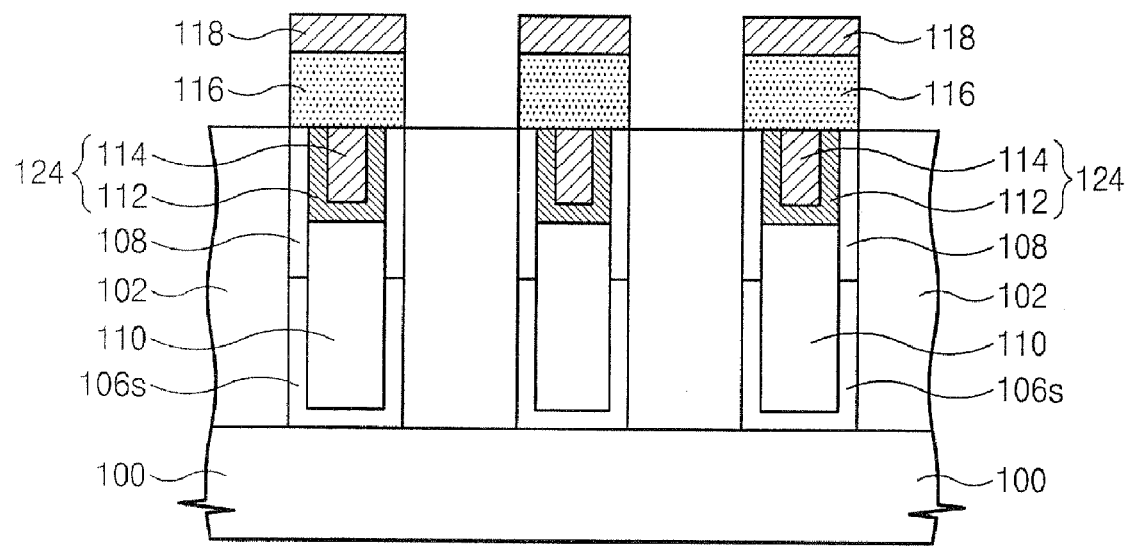

FIG. 4A is a plan view of a phase change memory device according to a first embodiment. FIG. 4B is a sectional view of the phase change memory device according to the first embodiment, taken along line II-II' of FIG. 4A.

Referring to FIGS. 4A and 4B, a phase change memory device may, for example, include a first conductor pattern 106s having a sidewall and a second conductor pattern 110 connected to the first conductor pattern 106s. In one embodiment, the sidewall of the first conductor pattern 106s may define a substantially cylindrical shape and the second conductor pattern 110 may fill an area defined by the sidewall of the first conductor pattern 106s. In one embodiment, the second conductor pattern 110 may be connected to the sidewall of the first conductor pattern 106s to form a diode. Accordingly, a contact area between the first and second conductor patterns 106s and 110 can be increased while occupying a relatively small area over a semiconductor substrate.

A bottom electrode 124 is connected to the second conductor pattern 110. A phase change layer 116 and the second conductor pattern 110 are electrically connected to each other through the bottom electrode 124. For example, the bottom electrode 124 may be formed on the second conductor pattern 110. In one embodiment, the bottom electrode 124 may include a first electrode 112 and a second electrode 114. The first electrode 112 may have a substantially cylindrical shape having a sidewall and a bottom. The second electrode 114 may fill an area surrounded by the sidewall of the first electrode 112.

The first conductor pattern 106s may include a semiconductor material having a first conductivity type. The second conductor pattern 110 may include a semiconductor material having a second conductivity type. Accordingly, a PN junction may be formed between first and second conductor patterns 106s and 110. In one embodiment, the second conductor pattern 110 may include a material that can establish a Schottky contact with the first conductor pattern 106s.

In the illustrated embodiment, the first conductor pattern 106s may be formed inside a hole 104 extending through an insulating layer 102. The hole 104 may expose a portion of a word line 100 formed on a semiconductor substrate. The first conductor pattern 106s may be formed in a lower region of the hole 104 to continuously cover the word line 100 and sidewalls of the lower region of the hole 104. An insulator pattern 108 may be formed on an upper region of the sidewall of the hole 104 such that the insulator pattern 108 overlies the first conductor pattern 106s. Accordingly, the insulator pattern 108 may define an area where the second conductor pattern 110 and the bottom electrode 124 are formed. In one embodiment, the insulator pattern 108 may be substantially cylindrically shaped with an open top and open bottom. In one embodiment, a sidewall of the insulator pattern 108 may be substantially aligned with a sidewall of the first conductor pattern 106s. In another embodiment, the sidewall of the insulator pattern 108 may be substantially flush with the sidewall of the first conductor pattern 106s.

In one embodiment, the top surface of the second conductor pattern 110 may be substantially coplanar with the top surface of the first conductor pattern 106s. In another embodiment, the top surface of the second conductor pattern 110 may be higher than the top surface of the first conductor pattern 106s and may contact the sidewall of the insulator pattern 108.

The phase change layer 116 is formed on the bottom electrode 124 and a top electrode 118 is formed on the phase change layer 116. Accordingly, the phase change layer 116 and the top electrode 118 are sequentially stacked on the bottom electrode 124. In one embodiment, the top electrode 118 may extend along a first direction to form a bit line.

In one embodiment, the word line 100 may be a diffusion layer having a conductivity type that is the same as the conductivity type of the first conductor pattern 106s. The word line 100 may extend along a second direction so as to cross beneath the top electrode 118. In the illustrated embodiment, the bit line 118 and the word line 100 may extend substantially perpendicularly with respect to each other.

The cell array includes a plurality of word lines 100 crossing under a plurality of bit lines 118. The first conductor pattern 106s, the second conductor pattern 110, and the bottom electrode 124 may be formed over an area of the semiconductor substrate where the word line 100 and the bit line 118 cross each other (hereinafter referred to as a "crossing area"). In one embodiment, the phase change layer 116 can be aligned with a top electrode 118 and extend along the same direction as the bit line 118. In such an embodiment, the phase change layer 116 may extend through a plurality of crossing areas. In another embodiment, the phase change layer 116 may be restrictively formed on the bottom electrode 124. In such an embodiment, the phase change layer 116 is present within a single crossing area.

As mentioned above, the word line 100 and the first conductor pattern 106s may have a first conductivity type and the second conductor pattern 110 may have a second conductivity type. In one embodiment, an impurity concentration of the first conductivity type within the first conductor pattern 106s may be lower than an impurity concentration of the first conductivity type within the word line 100.

The first conductor pattern 106s may ohmically contact the word line 100. The first conductor pattern 106s and the second conductor pattern 110 may include a material such as an epitaxially grown semiconductor layer. The first electrode 112 may include a material such as a metal, a metal alloy, or the like or a combination thereof. For example, the first electrode 112 may include titanium, titanium nitride, or the like or a combination thereof. The second electrode 114 may include a material such as a metal, a metal silicide, or the like or a combination thereof.

In one embodiment, a top surface of the second conductor pattern 110 may be substantially coplanar with a top surface of the insulating layer 102, thereby substantially filling the hole 104. In such an embodiment, the bottom electrode 124 may be formed on the top surface of the insulating layer 102 and be connected to the second conductor pattern 110. The phase change layer 116 and the top electrode 118 may be sequentially stacked on the bottom electrode 124.

FIGS. 5 through 10 are sectional views illustrating an exemplary method of fabricating a phase change memory device according to the first embodiment.

Figure 5:
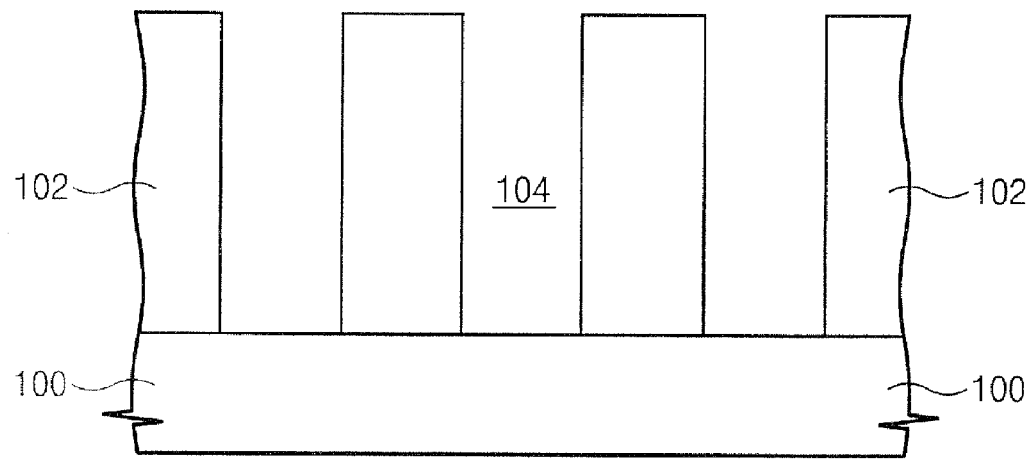
FIGS. 5 through 10 are sectional views illustrating an exemplary method of fabricating a phase change memory device according to the first embodiment.

Referring to FIG. 5, an insulating layer 102 with a hole 104 is formed on a semiconductor substrate. In a cell array region of the semiconductor substrate, the insulating layer 102 may have a plurality of holes 104 and a plurality of word lines 100 may be formed below the insulating layer 102 and be exposed by the plurality of holes 104. In one embodiment, the word lines 100 may include a diffusion layer of a first conductivity type. In another embodiment, the word lines 100 include a conductive metal pattern, or the like. The holes 104 may be spaced apart from each other along a row direction and a column direction by a predetermined pitch.

Figure 6:
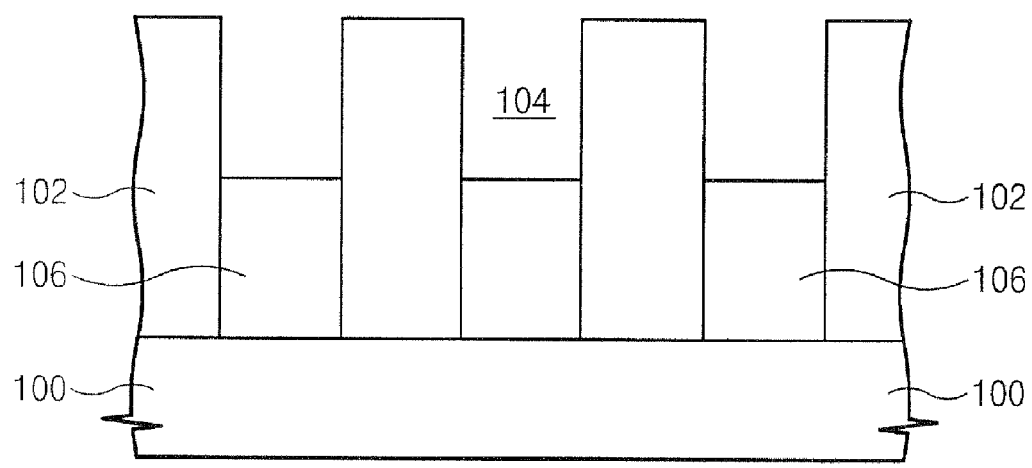

Referring to FIG. 6, a conductive pattern 106 may be formed inside the hole 104. The conductive pattern 106 may include a semiconductor material doped with an impurity having a first conductivity type. For example, the conductive pattern 106 may include a semiconductor material epitaxially grown from a portion of the semiconductor substrate exposed through the hole 104. In one embodiment, the conductive pattern 106 may be formed by epitaxially growing an epitaxial layer to a predetermined height within the hole 104. In another embodiment, the conductive pattern 106 may be formed by epitaxially growing an epitaxial layer to completely fill the hole 104 followed by etching the epitaxial layer to form the conductive pattern 106 that fills the hole 104 up to the predetermined height. The conductive pattern 106 may, for example, be doped during the epitaxial growing process or may be doped using an ion implantation process after the epitaxial growing process (e.g., after etching the epitaxial layer). The conductive pattern 106 may be doped in a low concentration. For example, the conductive pattern 106 may have an impurity concentration of the first conductivity type that is lower than an impurity concentration of the word lines 100.

Figure 7:
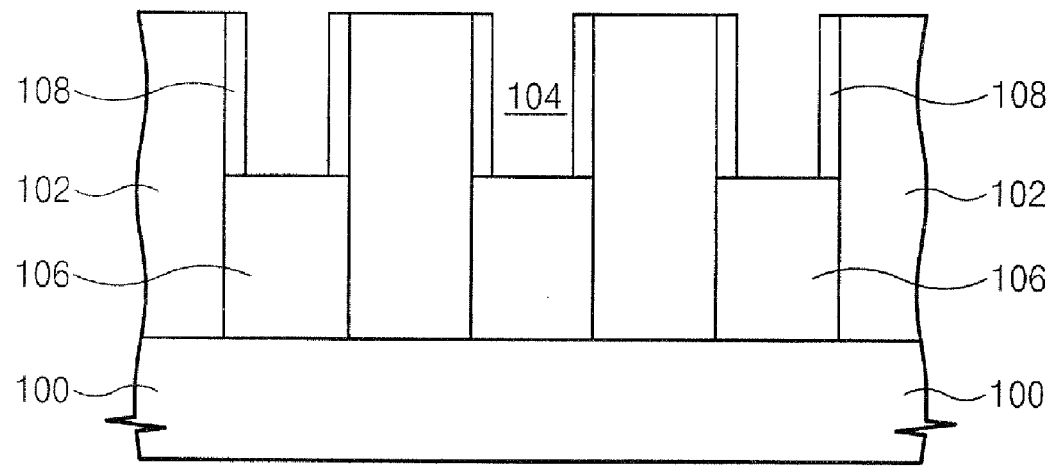

Referring to FIG. 7, an insulator pattern 108 may be formed to cover the sidewall of the hole 104 and be disposed on the conductive pattern 106. The insulator pattern 108 may be formed along the sidewall of the hole 104 such that it has a substantially cylindrical shape. In one embodiment, the insulator pattern 108 may be formed using a spacer formation process. For example, a spacer layer may be formed over the insulating layer 102 and within the hole 104 so as to cover the conductive pattern 106. Subsequently, the spacer layer may be anisotropically etched to form the insulator pattern 108. The spacer layer has etching rate different from that of the insulating layer 102. That is, the spacer layer may include a material that is capable of being etched selectively with respect to a material of the insulating layer 102. For example, the insulating layer 102 may include silicon oxide and the spacer layer may include silicon nitride.

Figure 8:
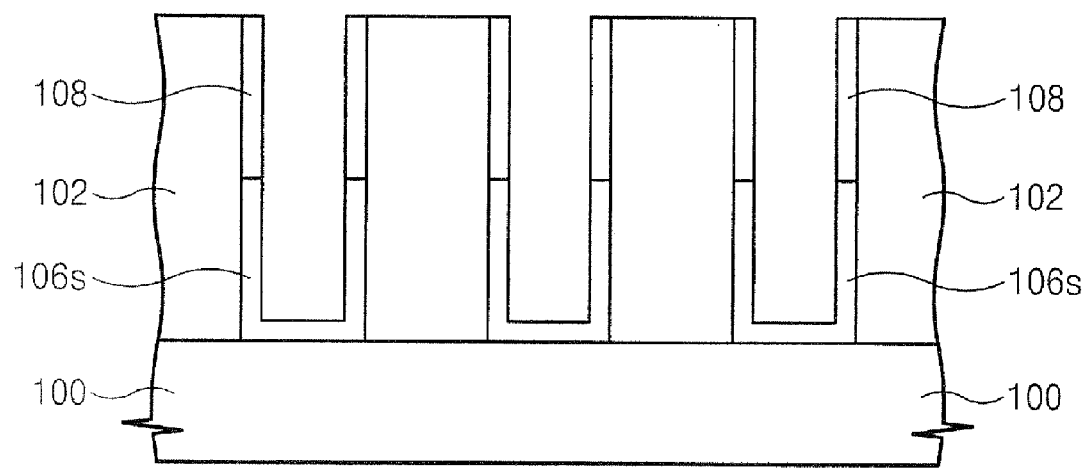

Referring to FIG. 8, the conductive pattern 106 is etched using the insulator pattern 108 as an etching mask. As a result, a first conductor pattern 106s having a closed bottom is formed such that a portion of the conductive pattern 106 remains on the word line 100. Moreover, a sidewall of the first conductor pattern 106s may be formed on the sidewall of the hole 104. Accordingly, a sidewall of the insulator pattern 108 may be substantially aligned with the sidewall of the first conductor pattern 106s. That is, the sidewall of the insulator pattern 108 may be substantially flush with the sidewall of the first conductor pattern 106s. As shown, the insulator pattern 108 may have a substantially cylindrical shape with an open top and open bottom.

Figure 9:
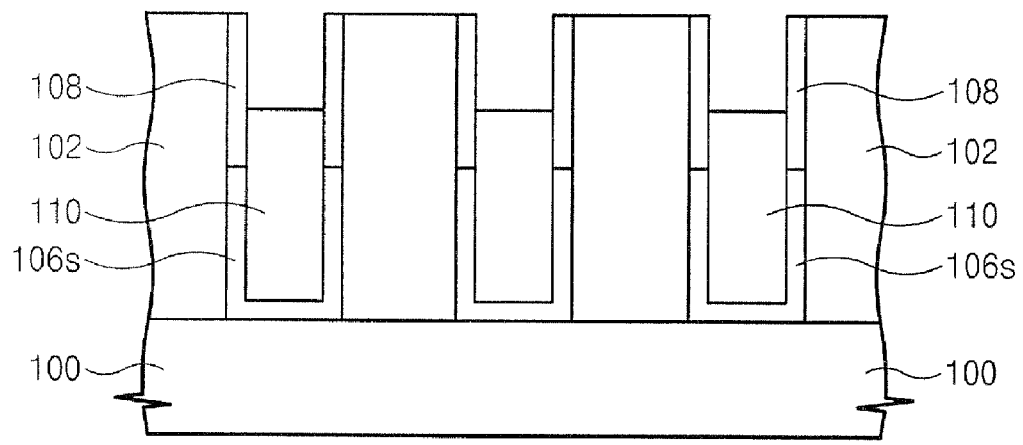

Referring to FIG. 9, a second conductor pattern 110 is formed in the first conductor pattern 106s. The second conductor pattern 110 may have a second conductivity type. For example, the second conductor pattern 110 may include a semiconductor material having a second conductivity type. In one embodiment, the second conductor pattern 110 may include an epitaxial layer grown from the first conductor pattern 106s. In such an embodiment, the second conductor pattern 110 may be doped during the epitaxial growing process, or may be doped using an ion implantation process after completing the epitaxial growing process. Therefore, the second conductor pattern 110 can have the second conductivity type. In one embodiment, the second conductive pattern 110 may be formed by epitaxially growing an epitaxial layer to a predetermined height within the hole 104. In another embodiment, the second conductive pattern 110 may be formed by epitaxially growing an epitaxial layer to completely fill the hole 104 followed by etching the epitaxial layer to form the second conductive pattern 110 that fills the hole 104 up to the predetermined height.

As mentioned above, the second conductor pattern 110 has the second conductivity type. Accordingly, the second conductor pattern 110 can form a PN-junction with the first conductor pattern 106s. The second conductor pattern 110 may fill an area defined by the sidewall of the first conductor pattern 106s. Accordingly, the first conductor pattern 106s and the second conductor pattern 110 can form a PN-junction diode. In one embodiment, a top surface of the second conductor pattern 110 may be substantially coplanar with a top surface of the first conductor pattern 106s. In another embodiment, the top surface of the second conductor pattern 110 may be higher than the top surface of the first conductor pattern 106s.

In one embodiment, the second conductor pattern 110 may not include a semiconductor material with the second conductivity type. In such an embodiment, the second conductor pattern 110 may include a material that can form a Schottky contact with the first conductor pattern 106s. Accordingly, the first conductor pattern 106s and the second conductor pattern 110 can form a Schottky diode.

Figure 10:
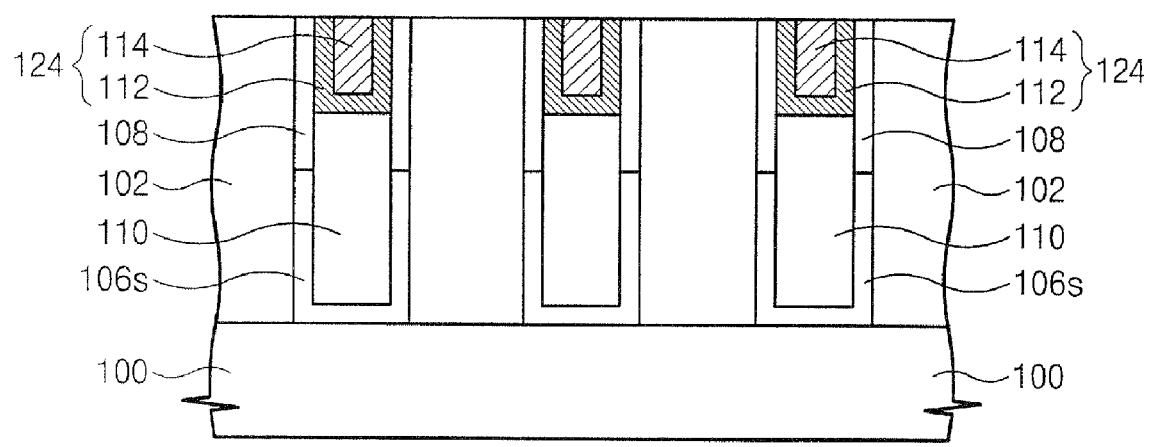

Referring to FIG. 10, a bottom electrode 124 is formed on the second conductor pattern 110. In one embodiment, the bottom electrode 124 may be formed by forming a substantially uniform first electrode layer along a curvature of the entire surface of the semiconductor substrate having the second conductor pattern 110 so as to form a groove on the second conductor pattern 110. A second electrode layer may then be formed on the first electrode layer to substantially fill the groove. Then, the first electrode layer and the second electrode layer are patterned (e.g., planarized) to form a first electrode 112 and the second electrode 114. As exemplarily illustrated, the first electrode 112 is formed on the second conductor pattern 110 in the hole 104 and the second electrode 114 substantially fills the groove formed by the first electrode 112.

Although not illustrated, a phase change layer and a top electrode can then be formed on the bottom electrode 124 to obtain the structure exemplarily shown in FIGS. 4A and 4B. As described above, the bottom electrode 124 is formed in the hole. In another embodiment, however, the second conductor pattern 110 may substantially fill the hole 104. In such an embodiment, the bottom electrode 124 may be formed on the second conductor pattern 110 and the insulating layer 102 and the phase change layer and top electrode may then be formed on the bottom electrode 124.

Figure 11A:
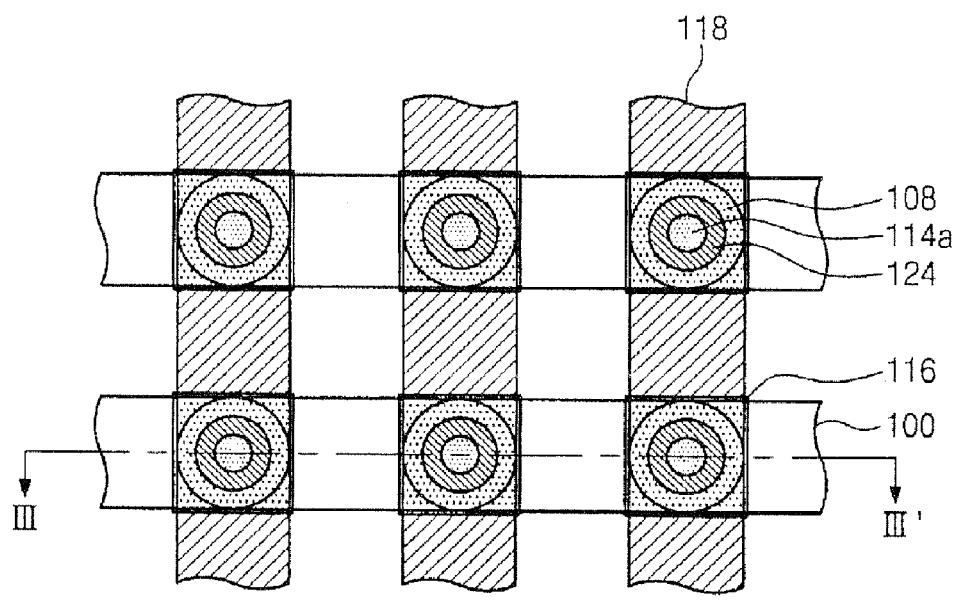
FIGS. 11A and 11B are plan and sectional views, respectively, of a phase change memory device according to a second embodiment.
Figure 11B:
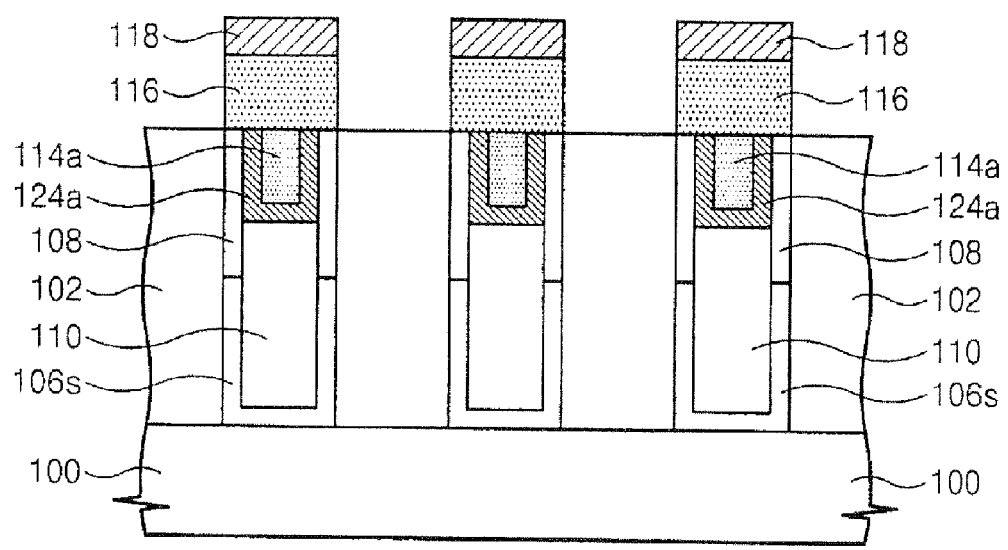

FIG. 11A is a plan view of a phase change memory device according to a second embodiment. FIG. 11B is a sectional view of the phase change memory device according to the second embodiment, taken along line III-III' of FIG. 11A.

Referring to FIGS. 11A and 11B, a phase change memory device of the second embodiment may, for example, include a substantially cylindrical bottom electrode 124a that contacts a phase change layer 116 in, for example, a substantially circular contact area. An insulating core 114a may be disposed over the bottom electrode 124a. Because the contact area between the bottom electrode 124a and the phase change layer 116 is substantially circular, the contact area between the bottom electrode 124a and the phase change layer 116 may be less than the contact area between the bottom electrode 124 and the phase change layer 116 described above with respect to FIGS. 4A and 4B. Accordingly, phase change occurs at a lower current because heat generation may be increased.

An exemplary method of forming a bottom electrode 124a may be similar to the above-described method of forming the bottom electrode 124. For example, as illustrated in FIG. 10, a substantially uniform first electrode layer may be formed along a curvature on the entire surface of the semiconductor substrate having the second conductor pattern 110 so as to form a groove on the second conductor pattern 110. Next, an insulating layer may be formed on the first electrode layer to substantially fill the groove. Then, the first electrode layer and the insulating layer may be patterned (e.g., planarized) to form a first electrode 112 and an insulating core 114a. The first electrode 112 may be formed on the second conductor pattern 110 in the hole and the insulating core 114a substantially fills the groove formed by the first electrode 112.

Figure 12A:
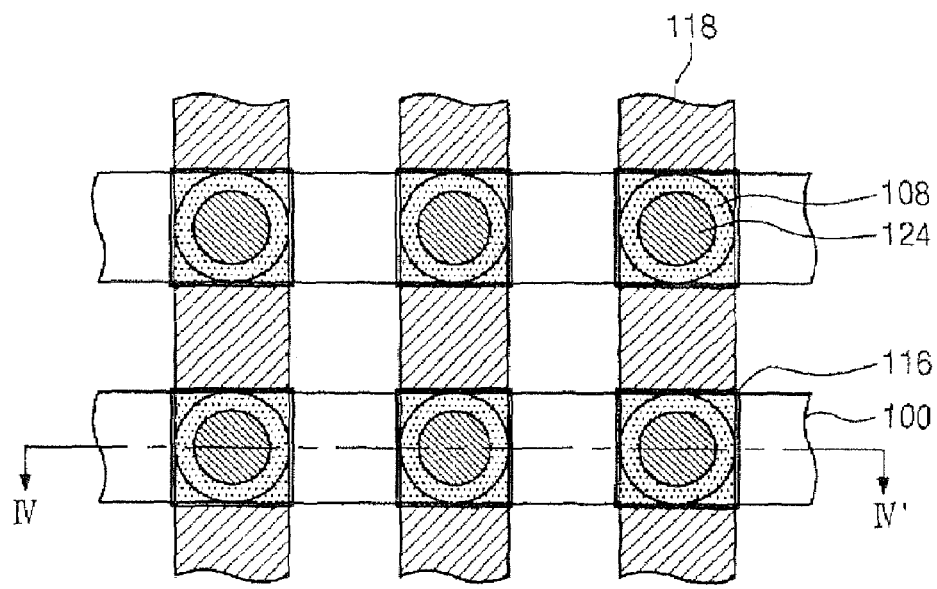
FIGS. 12A and 12B are plan and sectional views, respectively, of a phase change memory device according to a third embodiment.
Figure 12B:
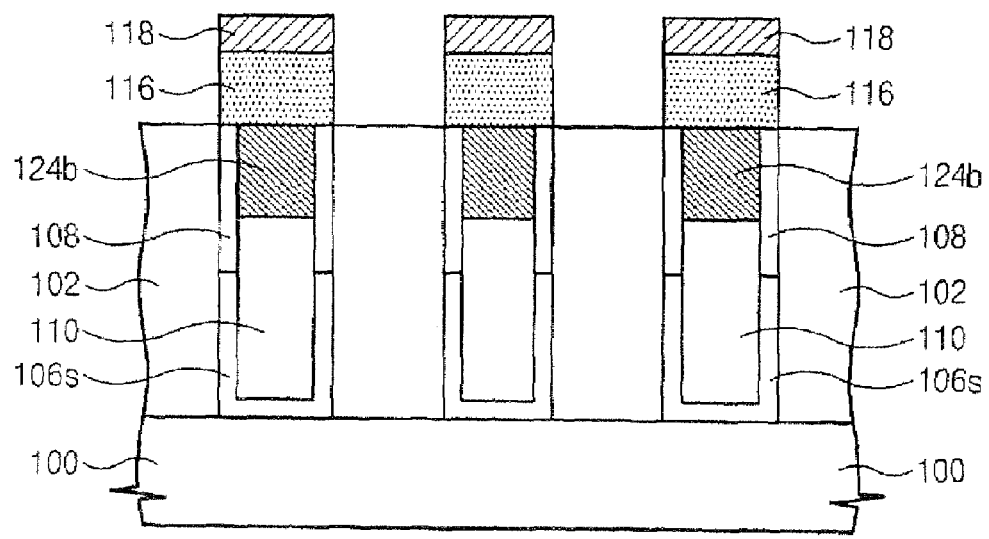

FIG. 12A is a plan view of a phase change memory device according to a third embodiment. FIG. 12B is a sectional view of the phase change memory device according to the third embodiment, taken along line IV-IV' of FIG. 12A.

Referring to FIGS. 12A and 12B, a phase change memory device of the third embodiment may, for example, include a bottom electrode 124b that substantially fills the hole 104 on the second conductor pattern 110. The bottom electrode 124b may include at least one layer including a material such as titanium, titanium silicide layer, or the like or a combination thereof. In one embodiment, the bottom electrode 124b may consist of a single metal layer.

According to the embodiments exemplarily described above with respect to FIGS. 4A, 4B, 11A, 11B, 12A and 12B, a heater may be formed to be interposed between the bottom electrode 124 and the phase change layer 116. In this case, an insulating layer may be formed with an opening and then a heater material may fill the opening, thereby forming a heater. Additionally, a spacer may be formed in the opening, thereby reducing the width of the opening within which the heater is formed. Consequently, the contact area between the phase change layer and the heater can be decreased such that a sufficient amount of heat can be generated using a relatively low current.

Figure 13:
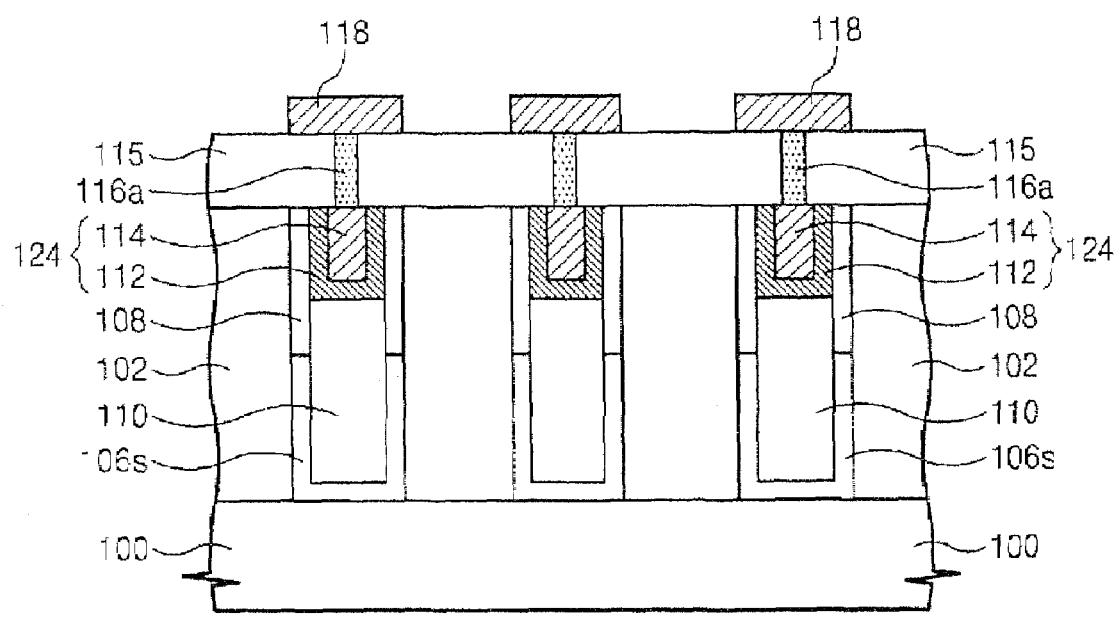
FIGS. 13 and 14 are sectional views of a phase change memory device according to fourth and fifth embodiments, respectively.
Figure 14:
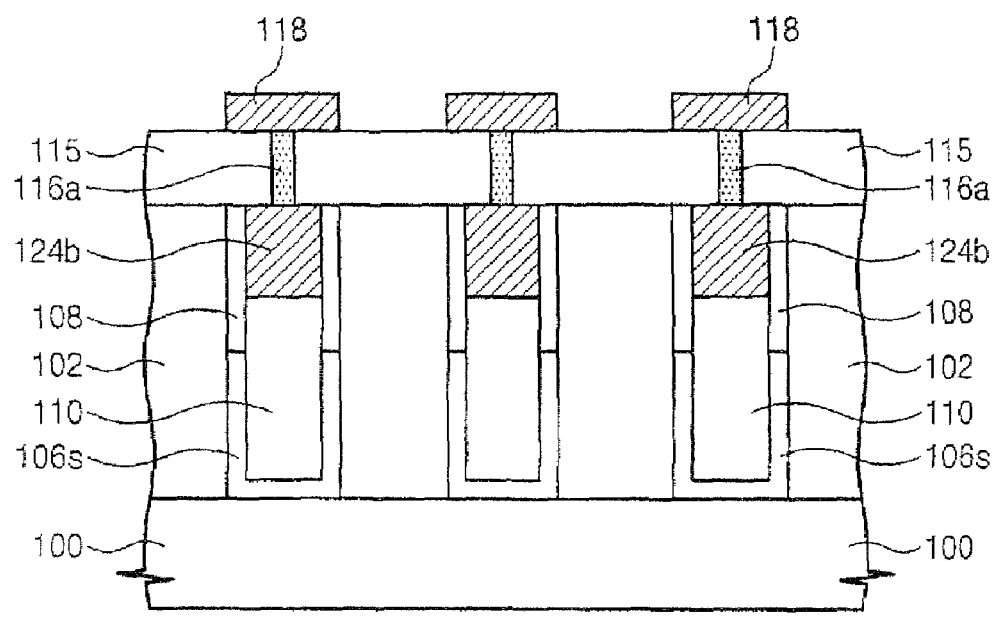

FIGS. 13 and 14 are sectional views of a phase change memory device according to fourth and fifth embodiments, respectively.

Referring to FIGS. 13 and 14, the phase change layer 116a may be formed in an opening (also referred to herein as a "pin hole") to increase a sheet resistance. For example, an insulating structure 115 having a pin hole 117 that exposes a bottom electrode 124 or 124b may be formed on the insulating layer 102, and then the phase change layer 116a may be formed to substantially fill the pin hole 117. The phase change layer 116a increases the sheet resistance by reducing a sectional area. Thus, phase change may occur anywhere in the pin hole, due to the heat generated from the increased sheet resistance when a current flows. That is, the phase change layer 116a may undergo a phase change due to a contact resistance between the phase change layer and the bottom electrode 124 or 124b, or self-generated heat caused by the sheet resistance.

According to some embodiments, the insulator pattern 108 may be removed before forming the second conductor pattern 110. In such embodiments, the second conductor pattern 110 may contact the sidewall of the first conductor pattern 106s as well as a sidewall of an upper region of the hole 104. In such a structure, a diode junction area between the first conductor pattern 106s and the second conductor pattern 110 can be further increased. As a result, current flow can be increased.

According to the embodiments exemplarily described above, the sidewall of the first conductor pattern is contacted by the second conductor pattern to increase the contact area therebetween while occupying a relatively small area over the semiconductor substrate. Accordingly, the degree of integration does not need to be lowered to increase a driving current.

According to the embodiments exemplarily described above, phase change within the phase change layer can occur at a low current by reducing a contact area between the bottom electrode and the phase change layer or by applying various heating mechanisms to induce phase change.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device, comprising:
   a diode formed on a semiconductor substrate, the diode comprising:
      a first conductor pattern of a first conductivity type and having an inner sidewall defining a structure; and
      a second conductor pattern directly on an electrically connected to the inner sidewall of the first conductor pattern, thereby being the diode;
   a phase change layer above and electrically connected to the second conductor pattern via a bottom electrode; and
   a top electrode on and connected to the phase change layer.

2. The semiconductor device of claim 1, wherein the inner sidewall of the first conductor pattern defines a substantially cylindrical structure.

3. The semiconductor device of claim 2, wherein the second conductor pattern fills an area surrounded by the inner sidewall of the first conductor pattern.

4. The semiconductor device of claim 3, further comprising:
   the bottom electrode between the second conductor pattern and the phase change layer,
   wherein the bottom electrode is formed on the second conductor pattern, and the phase change layer and the top electrode are sequentially stacked on the bottom electrode.

5. The semiconductor device of claim 4, wherein the bottom electrode comprises a substantially cylindrical first electrode having a sidewall and a bottom, the bottom contacting the second conductor pattern.

6. The semiconductor device of claim 5, wherein the bottom electrode further comprises a second electrode filling an area surrounded by the sidewall of the first electrode,
   wherein the phase change layer contacts a top surface of the first electrode and a top surface of the second electrode.

7. The semiconductor device of claim 5, further comprising an insulating layer pattern filling an area surrounded by the sidewall of the first electrode,
   wherein the phase change layer contacts a top surface of the first electrode and a top surface of the insulating layer pattern.

8. The semiconductor device of claim 4, wherein the bottom electrode comprises a metal, a conductive alloy, or a combination thereof, and wherein the bottom electrode contacts the phase change layer.

9. The semiconductor device of claim 1, further comprising a substantially cylindrical insulating layer pattern and the bottom electrode,
   wherein the first conductor pattern has a substantially cylindrical structure,
   wherein the substantially cylindrical insulating layer pattern is formed over the inner sidewall of the first conductor pattern,
   wherein the second conductor pattern fills an area surrounded by the inner sidewall of the first conductor pattern, and
   wherein the bottom electrode is connected to the phase change layer and fills an area surrounded by a sidewall of the substantially cylindrical insulating layer pattern.

10. The semiconductor device of claim 1, further comprising a diffusion layer of the first conductivity type formed below the first conductor pattern and connected to the first conductor pattern.

11. The semiconductor device of claim 10, wherein the diffusion layer has an impurity concentration higher than an impurity concentration of the first conductor pattern.

12. The semiconductor device of claim 1, wherein the second conductor pattern has a second conductivity type and forms a PN junction with the first conductor pattern.

13. The semiconductor device of claim 1, wherein the second conductor pattern forms a Schottky junction with the first conductor pattern.

14. A method of fabricating a semiconductor device, the method comprising:
   forming a first conductor pattern of a first conductivity type on a semiconductor substrate, the first conductor pattern having an inner sidewall defining a structure;
   forming a second conductor pattern directly on and electrically connected to the inner sidewall of the first conductor pattern, thereby forming a diode;
   forming a phase change layer above and electrically connected to the second conductor via a bottom electrode; and
   forming a top electrode on and connected to the phase change layer.

15. The method of claim 14, further comprising forming an insulating layer on the semiconductor substrate, the insulating layer having a hole,
   wherein the first conductor pattern and the second conductor pattern are formed in the hole.

16. The method of claim 15, wherein the first conductor pattern is formed in a lower region of the hole and has a substantially cylindrical structure having the inner sidewall and a bottom; and
   the second conductor pattern is on the first conductor pattern and fills an area surrounded by the first conductor pattern.

17. The method of claim 16, wherein the second conductor pattern comprises a semiconductor of a second conductivity type.

18. The method of claim 16, wherein the second conductor pattern forms a Schottky junction with the first conductor pattern.

19. The method of claim 16, further comprising forming the bottom electrode on the second conductor pattern and in the hole.

20. The method of claim 15, wherein forming the first conductor pattern comprises:
   growing an epitaxial layer in the lower region of the hole;
   forming a substantially cylindrical insulator pattern on a sidewall of the hole above the epitaxial layer; and
   etching the epitaxial layer using the insulator pattern as an etching mask.

21. The method of claim 20, wherein forming the second conductor pattern comprises growing an epitaxial layer on the first conductor pattern to fill an area surrounded by the first conductor pattern.

22. The method of claim 21, further comprising:
forming the bottom electrode on the second conductor pattern and in an area surrounded by the insulator pattern; and
forming the phase change layer on the bottom electrode.

23. The method of claim 22, wherein forming the bottom electrode comprises:
forming a conductive layer over the semiconductor substrate and filling an area surrounded by the insulator pattern; and
patterning the conductive layer to form the bottom electrode, the bottom electrode filling the area surrounded by the insulator pattern.

24. The method of claim 23, wherein forming the conductive layer comprises:
forming a first conductive layer over the semiconductor substrate and within the hole, wherein the first conductive layer defines a groove over the second conductor pattern;
forming a second conductive layer on the first conductive layer to fill the groove; and
patterning the first conductive layer and the second conductive layer to form a substantially cylindrical first electrode and a second electrode, the substantially cylindrical first electrode being formed on an area surrounded by the insulator pattern and the second electrode being surrounded by the substantially cylindrical first electrode.

25. The method of claim 22, further comprising:
forming a conductive layer over the semiconductor substrate and within the hole, wherein the conductive layer defines a groove over the second conductor pattern;
forming an insulating layer on the conductive layer to fill the groove; and
patterning the insulating layer and the conductive layer to form a substantially cylindrical bottom electrode having an insulator core in an area surrounded by the insulator pattern.

26. The method of claim 14, further comprising:
forming a conductive line of a first conductivity type,
wherein the first conductor pattern is formed on the conductive line and the conductive line has an impurity concentration of the first conductivity type higher than an impurity concentration of the first conductor pattern.

* * * * *